United States Patent
Nordin et al.

(10) Patent No.: US 10,516,263 B2
(45) Date of Patent: Dec. 24, 2019

(54) CAPACITOR-BASED UPS

(71) Applicant: Panduit Corp., Tinley Park, IL (US)

(72) Inventors: Ronald A. Nordin, Naperville, IL (US); Masud Bolouri-Saransar, Orland Park, IL (US); Edward Clarence Shultz, Wheaton, IL (US); John Bohdan Melinyshyn, Arlington Heights, IL (US)

(73) Assignee: Panduit Corp., Tinley Park, IL (US)

( * ) Notice: Subject to any disclaimer, the term of this patent is extended or adjusted under 35 U.S.C. 154(b) by 0 days.

(21) Appl. No.: 15/943,894

(22) Filed: Apr. 3, 2018

(65) Prior Publication Data

US 2018/0301899 A1  Oct. 18, 2018

Related U.S. Application Data

(62) Division of application No. 13/914,269, filed on Jun. 10, 2013, now Pat. No. 9,966,758.

(60) Provisional application No. 61/658,098, filed on Jun. 11, 2012, provisional application No. 61/696,363, filed on Sep. 4, 2012, provisional application No. 61/722,990, filed on Nov. 6, 2012.

(51) Int. Cl.

| H02J 9/06 | (2006.01) |
|---|---|
| H02J 1/00 | (2006.01) |
| H02J 7/00 | (2006.01) |
| H02J 7/34 | (2006.01) |
| G01R 31/42 | (2006.01) |
| G01R 31/02 | (2006.01) |

(52) U.S. Cl.
CPC .............. *H02J 1/00* (2013.01); *H02J 7/0014* (2013.01); *H02J 7/0016* (2013.01); *H02J 9/061* (2013.01); *G01R 31/028* (2013.01); *G01R 31/42* (2013.01); *H02J 7/0021* (2013.01); *H02J 7/345* (2013.01); *Y10T 307/50* (2015.04)

(58) Field of Classification Search
CPC ................ H02J 9/00–08; H02J 7/0016; Y10T 307/615–636
See application file for complete search history.

(56) References Cited

U.S. PATENT DOCUMENTS

| 5,586,042 A | 12/1996 | Pisau |
| 6,774,602 B2 | 8/2004 | Ballard et al. |

(Continued)

FOREIGN PATENT DOCUMENTS

| DE | 102008040310 A1 | 1/2010 |
| EP | 1901413 A2 | 3/2008 |

(Continued)

OTHER PUBLICATIONS

Linear Technology "LTC37879 High Efficiency, Synchronius, 4-Switch Buck-Boost Controller,"; 30 pages; 2010.

*Primary Examiner* — Fritz M Fleming
(74) *Attorney, Agent, or Firm* — Christopher S. Clancy; James H. Williams; Christopher K. Marlow

(57) ABSTRACT

The present invention generally relates to the field of uninterruptable power supplies (UPSs) and more specifically, to UPSs using supercapacitors (also may be referred to as ultracapacitors) and/or other capacitor and/or battery elements. In an embodiment, a UPS of the present invention can individually regulate the charging of its capacitive elements to avoid overcharging and/or achieve a more efficient charge state.

11 Claims, 19 Drawing Sheets

(56) References Cited

U.S. PATENT DOCUMENTS

| | | |
|---|---|---|
| 6,809,433 B2 | 10/2004 | Nozu |
| 6,812,591 B2 | 11/2004 | Umemura et al. |
| 7,259,475 B2 | 8/2007 | Hong et al. |
| 7,417,405 B2 | 8/2008 | Carrier |
| 7,492,130 B2 * | 2/2009 | Daboussi .............. H02J 7/0016 320/166 |
| 7,633,181 B2 | 12/2009 | Gross et al. |
| 7,705,562 B2 | 4/2010 | Takahashi et al. |
| 8,008,894 B2 | 8/2011 | Sartore |
| 8,035,356 B2 | 10/2011 | Mentelos |
| 8,154,258 B2 | 4/2012 | Pappas et al. |
| 8,155,903 B2 | 4/2012 | Weber |
| 8,228,044 B2 | 7/2012 | Kötz et al. |
| 8,264,208 B2 | 9/2012 | Wardensky |
| 9,966,758 B2 * | 5/2018 | Nordin .................... H02J 9/061 |
| 2003/0214267 A1 | 11/2003 | Long |
| 2005/0052085 A1 * | 3/2005 | Chang .................... H02J 9/061 307/66 |
| 2006/0082351 A1 | 4/2006 | Martins et al. |
| 2007/0001651 A1 | 1/2007 | Harvey |
| 2007/0139018 A1 | 6/2007 | Mentelos |
| 2009/0195079 A1 * | 8/2009 | Barrenscheen ....... H02J 7/0016 307/109 |
| 2010/0156359 A1 | 6/2010 | Wardensky |
| 2011/0187197 A1 | 8/2011 | Moth |
| 2011/0227416 A1 * | 9/2011 | Lecourtier .............. H02J 9/061 307/66 |
| 2011/0302432 A1 | 12/2011 | Harris et al. |
| 2012/0019070 A1 | 1/2012 | Matsuoka et al. |

FOREIGN PATENT DOCUMENTS

| | | | |
|---|---|---|---|
| WO | WO2005091112 A1 | 9/2005 | |
| WO | WO-2010061116 A2 * | 6/2010 | ............. H02J 9/061 |
| WO | WO2012006115 A2 | 1/2012 | |

* cited by examiner

| Case 1: With Cell Balancing Turned OFF |   |   |   |   |   |   |   |   |
|---|---|---|---|---|---|---|---|---|
|  | 0 | 60 | 120 | 240 | 360 | 480 | 960 |
| $V_1$ | 0 | 0.171 | 0.343 | 0.686 | 1.029 | 1.371 | 2.743 |
| $V_2$ | 0 | 0.171 | 0.343 | 0.686 | 1.029 | 1.371 | 2.743 |
| $V_3$ | 0 | 0.171 | 0.343 | 0.686 | 1.029 | 1.371 | 2.743 |
| $V_4$ | 0 | 0.171 | 0.343 | 0.686 | 1.029 | 1.371 | 2.743 |
| $V_5$ | 0 | 0.156 | 0.312 | 0.623 | 0.935 | 1.247 | 2.494 |
| delta V | | -0.016 | -0.031 | -0.062 | -0.094 | -0.125 | -0.249 |

| Case 2: With Cell Balancing Turned ON (threshold voltage on = 30mV, threshold off = 10mV, $R_l$ = 10 Ω) |   |   |   |   |   |   |   |   |   |   |
|---|---|---|---|---|---|---|---|---|---|---|
|  | 0 | 60 | 115 | 660 | 735 | 796 | 874 | 924 | 1004 |
| $V_1$ | 0 | 0.171 | 0.329 | 1.724 | 1.939 | 2.078 | 2.301 | 2.410 | 2.638 |
| $V_2$ | 0 | 0.171 | 0.329 | 1.724 | 1.939 | 2.078 | 2.301 | 2.410 | 2.638 |
| $V_3$ | 0 | 0.171 | 0.329 | 1.724 | 1.939 | 2.078 | 2.301 | 2.410 | 2.638 |
| $V_4$ | 0 | 0.171 | 0.329 | 1.724 | 1.939 | 2.078 | 2.301 | 2.410 | 2.638 |
| $V_5$ | 0 | 0.156 | 0.299 | 1.714 | 1.909 | 2.068 | 2.270 | 2.400 | 2.608 |
| delta V | | -0.016 | -0.030 | -0.010 | -0.030 | -0.010 | -0.030 | -0.010 | -0.030 |
|  |  | off | on | off | on | off | on | off | on |

Applet
Unit Status | Cell Status

Input Voltage OK ○
Total Stack Voltage [18.6] V
Charge Status [Discharging]
Charge [83] %     Time to Full Charge [12] min
Capacity [3.2] kJ (kW-s)
Charging Power [13.0] W
Load Power Consumption [28.0] W
Estimated Hold Time [2] min [13] sec
Fault Status ● [Output Overload]

Charge Speed [Medium]
External Supply [23.9] V [1.17] A
UPS Input [24.1] V [0.54] A
UPS Output [22.1] V [0.00] A
Model Number [PW1701A]
Serial Number [PC12130001]
Firmware Version [1.0.0]
Elapsed Time [181] hrs [1] min [58] sec

| Time | Event |
|------|-------|
|      |       |

PANDUIT LABORATORIES

FIG.12A

CAPACITOR-BASED UPS

CROSS-REFERENCE TO RELATED APPLICATIONS

This application is a divisional of, and claims the benefit of priority to, U.S. application Ser. No. 13/914,269, filed on Jun. 10, 2013, which issued as U.S. Pat. No. 9,966,758 on May 8, 2018, which claims the benefit of U.S. Provisional Patent Application No. 61/658,098 filed on Jun. 11, 2012, U.S. Provisional Patent Application No. 61/696,363 filed on Sep. 4, 2012, and U.S. Provisional Patent Application No. 61/722,990 filed on Nov. 6, 2012, all of which are incorporated herein by reference in their entireties.

FIELD OF INVENTION

The present invention generally relates to the field of uninterruptable power supplies (UPSs) and more specifically, to UPSs using supercapacitors (also may be referred to as ultracapacitors) and/or other capacitor and/or battery elements.

BACKGROUND

Uninterruptable power supplies (UPSs) have served the data center and the industrial industry for many years. These UPSs are often implemented upstream of the network equipment, towards a facility's power entrance, and may be positioned in a centralized fashion to service an entire data center facility. Typically, 480 V (volt) AC (alternating current) is converted to DC (direct current) where batteries are used to store the energy. At a later time, the stored DC voltage is re-converted back to AC voltage for distribution throughout a facility. There is a trend in the industry to distribute this UPS functionality down to the individual racks of a data center in an attempt to obtain improved energy efficiency. Other benefits of this distribution can include capital savings, improved scalability, and improved system reliability. However, at least one of the disadvantages of this technique is that battery packs that are associated with individual racks often require maintenance as well as replacement after a relatively short lifetime.

Another trend in the industry is the replacement of traditional batteries with supercapacitors. These supercapacitors can have improved lifetime as compared to common batteries (e.g., 5 times the lifetime of a typical battery) and can result in improved performance versus batteries in a distributed UPS architecture.

The combination of these two trends leads to the opportunity for the development of a supercapacitor-based UPS for use in facilities such as data centers and industrial facilities.

SUMMARY

Accordingly, at least some embodiments of the present invention are generally directed to various capacitor-based UPSs and methods of use thereof.

In one embodiment, the present invention is a supercapacitor-based UPS system.

In another embodiment, the present invention is a module-based battery/capacitor unit.

In yet another embodiment, the present invention relates to charging techniques and methods.

In yet another embodiment, the present invention relates to redundancy techniques with a shared DC voltage bus across cabinets.

In yet another embodiment, the present invention relates to mounting options for a UPS and/or a UPS system.

In yet another embodiment, the present invention is a UPS comprising at least one energy storage module having a plurality of capacitive elements, input circuitry for providing electrical power from an input to the at least one energy storage module, output circuit for providing electrical power from the at least one energy storage module to an output, and charge-balancing circuitry. The charge-balancing circuitry at least partially retards charging of at least one the capacitive element when a voltage across the at least one the capacitive element is determined to be greater than a voltage across at least one other the capacitive element by at least some first threshold amount, and the charge-balancing circuitry resumes normal charging of the at least one the capacitive element when the voltage across the at least one the capacitive element is determined to be less than the voltage across the at least one other the capacitive element by at least some second threshold amount.

In yet another embodiment, the present invention is a UPS comprising at least one energy storage module having a plurality of capacitive elements, input circuitry for providing electrical power from an input to the at least one energy storage module, output circuit for providing electrical power from the at least one energy storage module to an output, communication circuitry providing a data communication link to an external managing device, and a microcontroller connected to the communication circuitry and the at least one energy storage module, where the microcontroller at least partially controls a maximum charge voltage across at least one the capacitive element in response to an input received from the communication circuitry.

In yet another embodiment, the present invention is a UPS comprising at least one energy storage module having a plurality of capacitive elements, input circuitry for providing electrical power from an input to the at least one energy storage module, output circuit for providing electrical power from the at least one energy storage module to an output, and capacity-measuring circuitry in communication with at least one the capacitive element. The capacity-measuring circuitry measures a first and a second voltage across the at least one the capacitive element, the measurement of the second voltage occurring at least some time $\Delta t$ after the measurement of the first voltage, and the capacity-measuring circuitry provides an output based at least in part on the first voltage, the second voltage, and the $\Delta t$.

These and other features, aspects, and advantages of the present invention will become better-understood with reference to the following drawings, description, and any claims that may follow.

BRIEF DESCRIPTION OF THE DRAWINGS

FIGS. 12A and 12B illustrate an embodiment of a computer interface for use with an embodiment of the present invention.

DETAILED DESCRIPTION

Supercapacitors (also referred to as ultra-capacitors or EDLCs (electrochemical double-layer capacitors)) typically have capacitance values that are between 10,000 and 1,000,000 times larger than traditional capacitors, making them good candidates for battery replacements. Some supercapacitors can have capacitances greater than 6000 F (Farads) at a maximum voltage of about 3 V. The energy stored in a capacitor follows the equation: $E=\frac{1}{2} CV^2$, where E is energy, C is capacitance, and V is potential difference (voltage). Hence, a supercapacitor having capacitance of 6000 F at 3 V can store 27.0 kJ (kilojoules) (or 7.5 W-hr (watt hours)). This is comparable to the energy stored in a standard D-cell sized battery. However, energy extraction from a capacitor is significantly different than that of common batteries. This difference is illustrated in FIG. 1.

Figure 1:
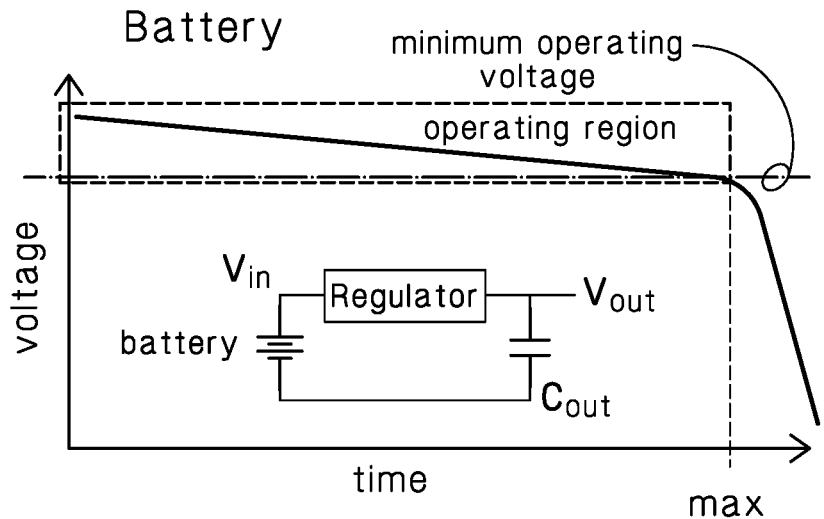
FIG. 1 illustrates typical discharge cycles of batteries and capacitors.
Figure 1:
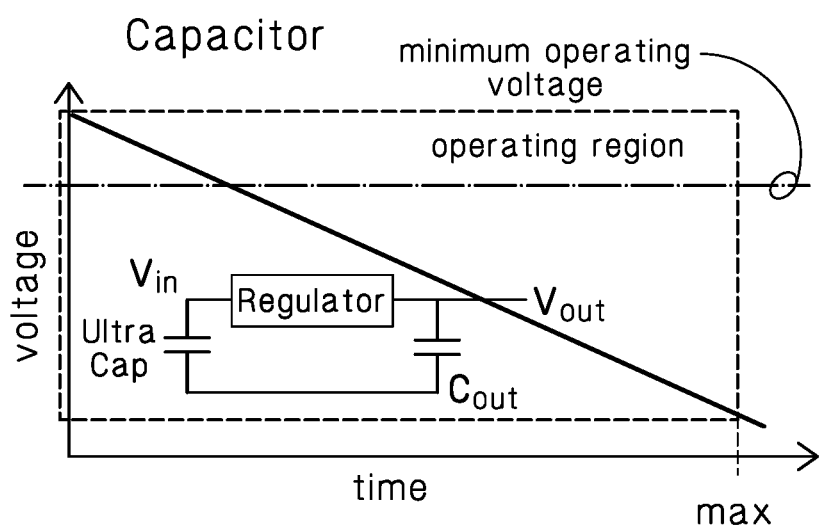

As illustrated in FIG. 1, with a constant current load, the battery voltage remains generally within an operating region until the maximum time $t_{max}$, where the battery can be considered discharged. For a capacitor, the voltage steadily declines until a minimum voltage is reached (at $t=t_{max}$) where the capacitor can be considered discharged. Note that with the capacitor-based system, when the capacitor voltage drops below the minimum operating voltage (for example, 12 V), the output voltage must be "boosted" to maintain the output voltage needed to stay within the operating region. Also note that with a capacitor-based system, by measuring the capacitor voltage (and knowing the capacitance), the energy capacity of the system may be calculated. With a battery-based system, an energy capacity measurement can be much more difficult to obtain.

Figure 2:
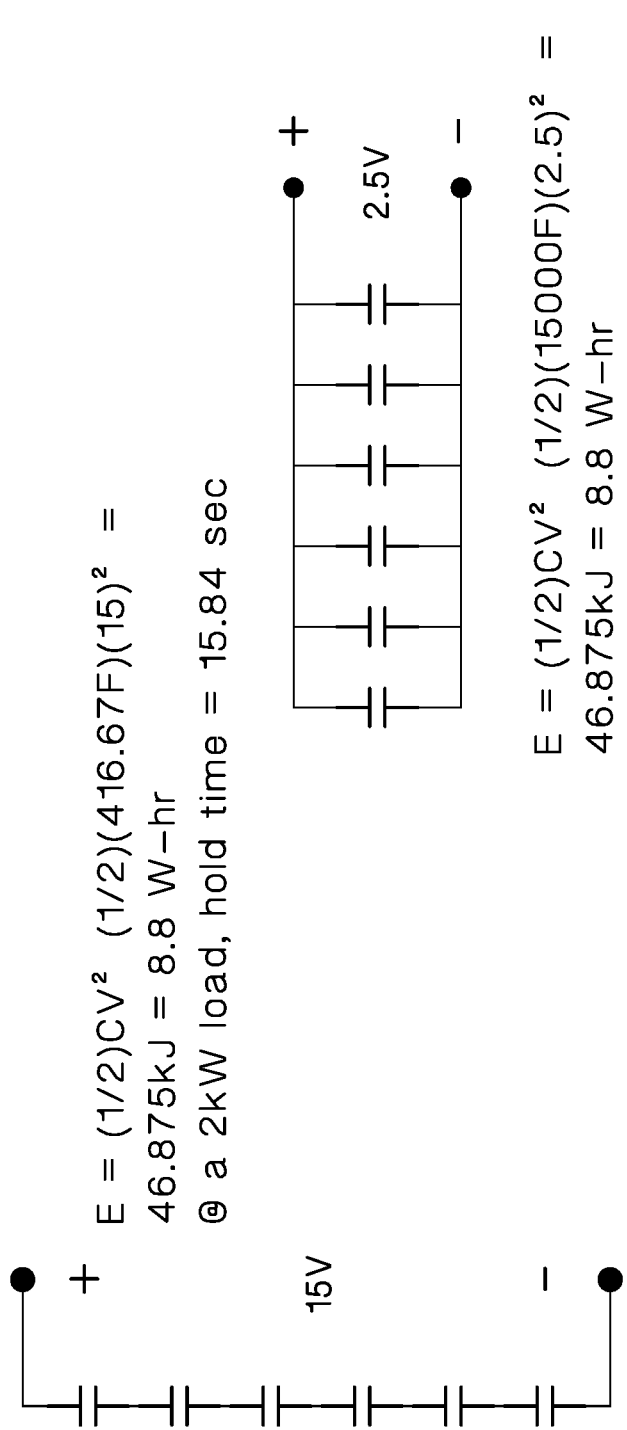
FIG. 2 illustrates series and parallel configurations for capacitors, and their associated energy capacities.

Building a UPS system with the required amount of energy capacity can require that capacitors be assembled in series and/or in parallel. FIG. 2 illustrates how the energy capacity of series (Case A) and parallel (Case B) capacitor circuits can be calculated. The examples of FIG. 2 use capacitors measuring 2500 F (at 2.5V). The hold time for these configurations with a 2 kW load is about 15.8 seconds. Note that a strictly parallel configuration may not be preferred because the regulator that follows the capacitor bank may need as much of a voltage range as possible. For example, in Case A, if the voltage range spans from about 15V to about 1V, then more than 99% of the energy is utilized. However, in Case B, for a voltage range that spans from about 2.5V to about 1V, only 84% is extracted. Hence higher voltages (with series-connected capacitors) can be more efficient. Also note that the hold time of 15.8 seconds would probably not be appropriate for a real-world system, as the real-world hold time would preferably be in the 4 to 5 minute range, requiring a larger system.

Figure 3:
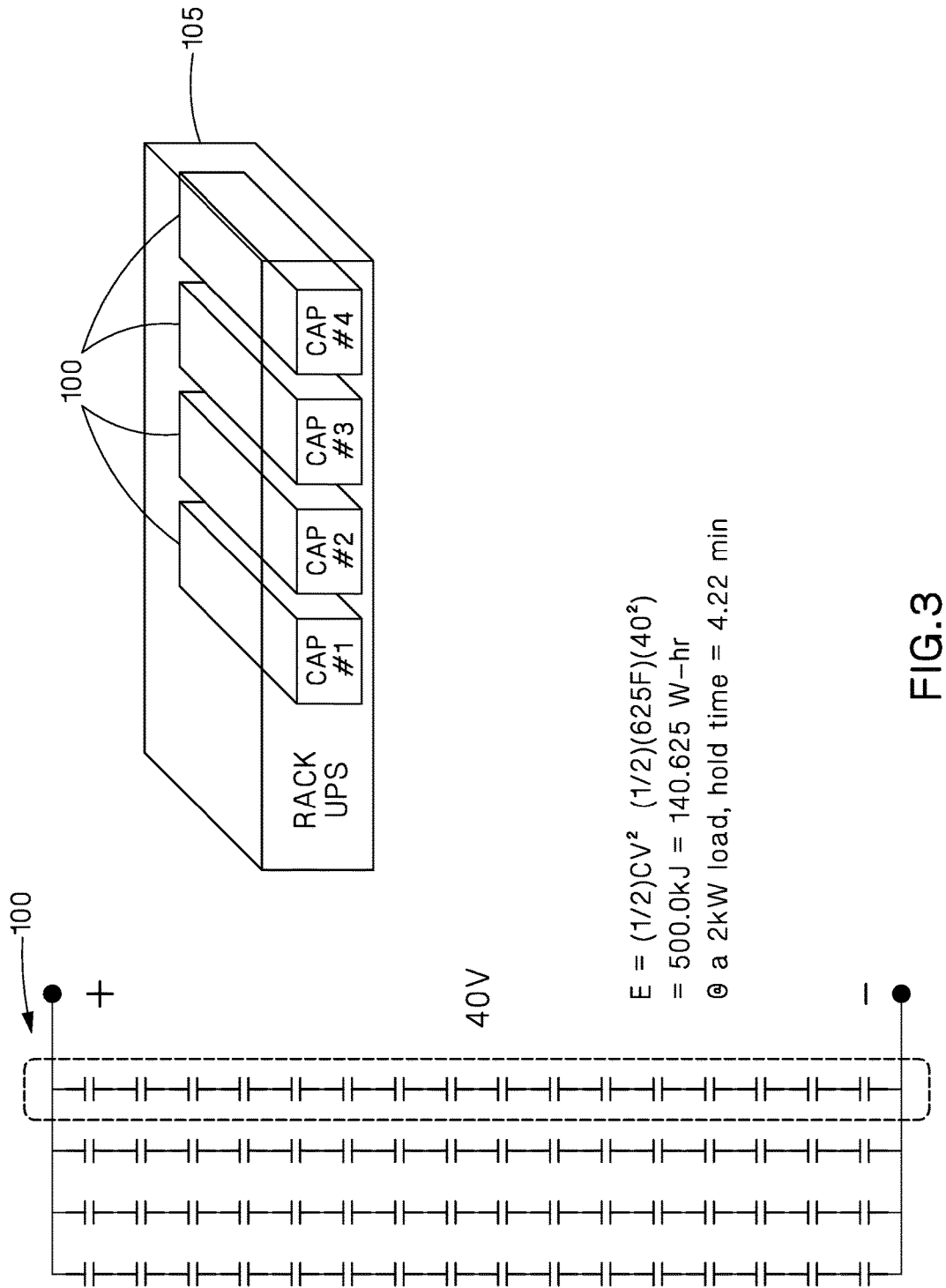
FIG. 3 illustrates a series/parallel supercapacitor configuration according to an embodiment of the present invention.

The capacitor configuration according to one embodiment of the present invention, as shown in FIG. 3, may be more appropriate for UPS applications, as the voltage as well as the capacitance values are increased (via parallelism). Combining the series groupings of capacitors into a module provides the ability to add versatility to a product manufactured in accordance with the present invention. For example, in one embodiment, one can add more modules 100 to a UPS 105 if a longer hold time is required. In another embodiment, one can add more modules 100 to a UPS 105 if a higher load needs to be sustained. In yet another embodiment, older modules 100 can be replaced with newer modules 100 having improved capacitance. In yet another embodiment, capacitors can be combined with batteries.

In one embodiment of the present invention, the modules are designed to include at least one of the following functionalities: "hot-pluggable" (meaning the ability to slide modules in and out of the unit/system without disrupting service); module scalability (modules can have different capacity ratings); module identification (so the UPS can identify the type and capacity of the modules that are plugged in); and the use of a single value of module output voltage where a plurality of modules outputs a single voltage (for example, 12V). These functionalities may allow the UPS unit to use new, more advanced modules as technology evolves, and may also allow battery-based modules to be used in combination with supercapacitor-based modules (and take advantage of newer battery technologies as they develop). In another embodiment, a UPS according to the present invention also has an additional input/output DC power connection. This can allow more than one unit to "share" the battery capacity across a number of cabinets. For example, if there are cabinets with low information technology (IT)-equipment loads, than by sharing the UPS capacity from those units to units that have a higher IT-equipment load it may be possible to allow the data center to sustain a more extended hold-time in the event that the data center has to rely on the UPS or the UPS system.

Figure 4:
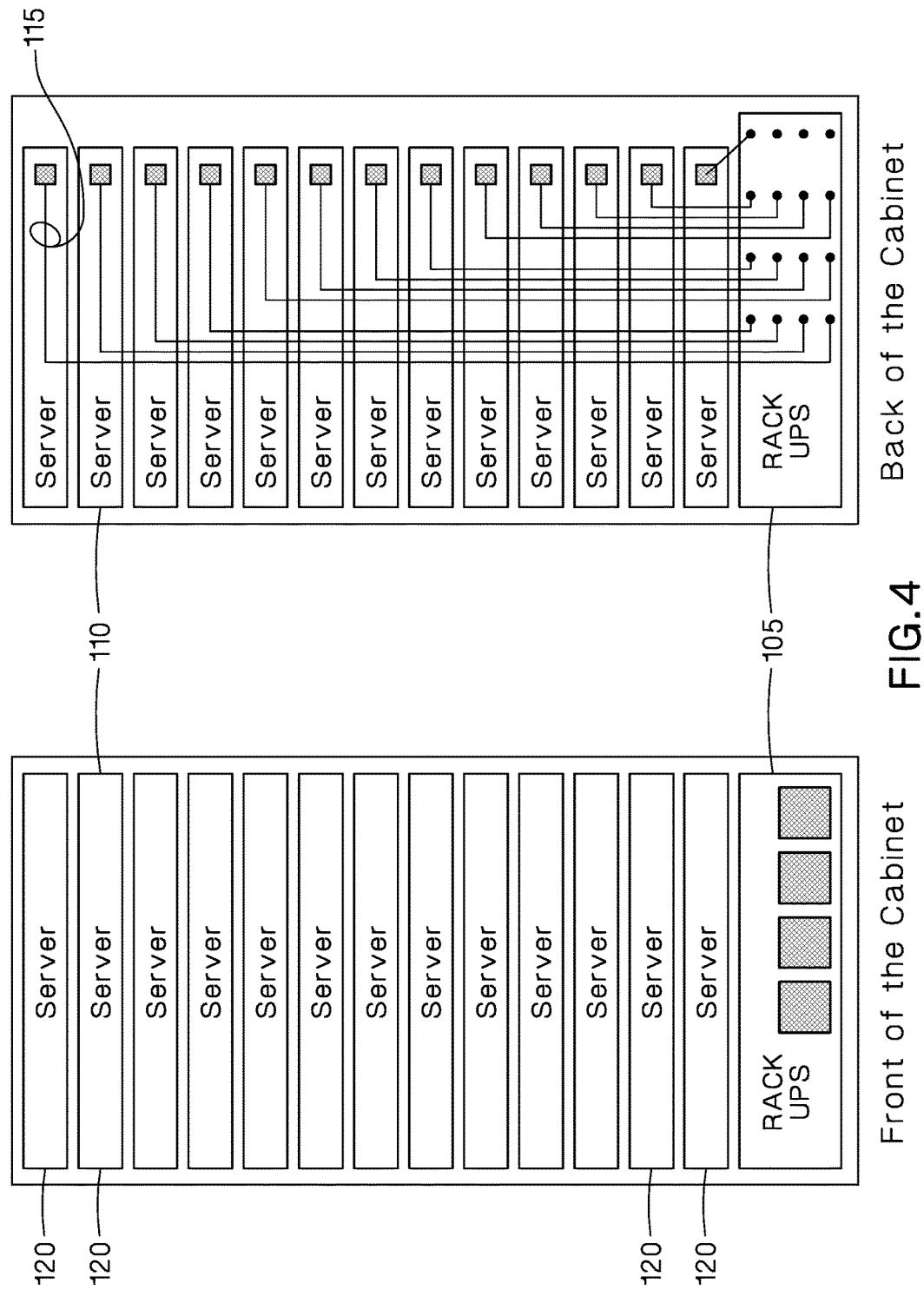
FIG. 4 illustrates a rack cabinet used together with a UPS according to an embodiment of the present invention.
Figure 5A:
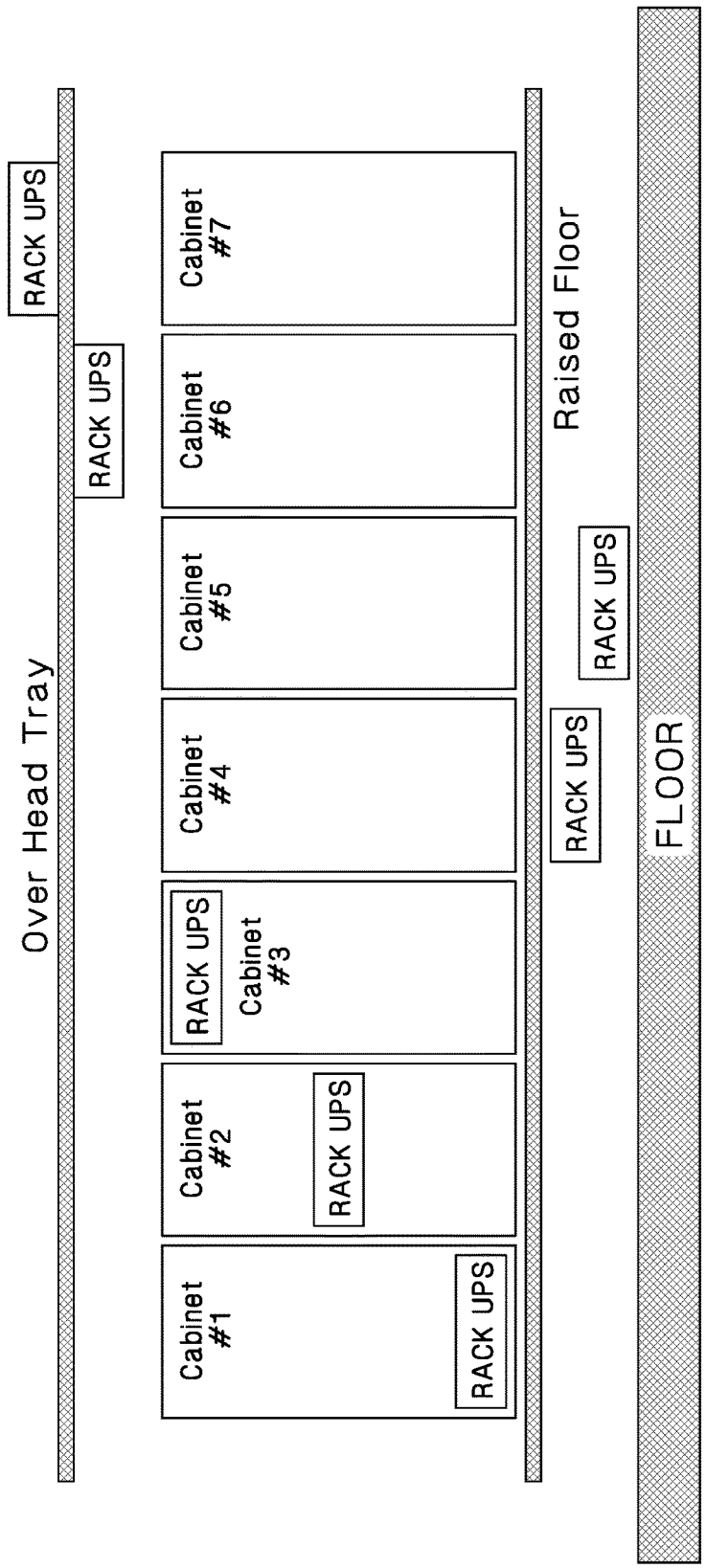
FIGS. 5A and 5B illustrate various embodiments of the present invention for use in a data center.
Figure 5B:
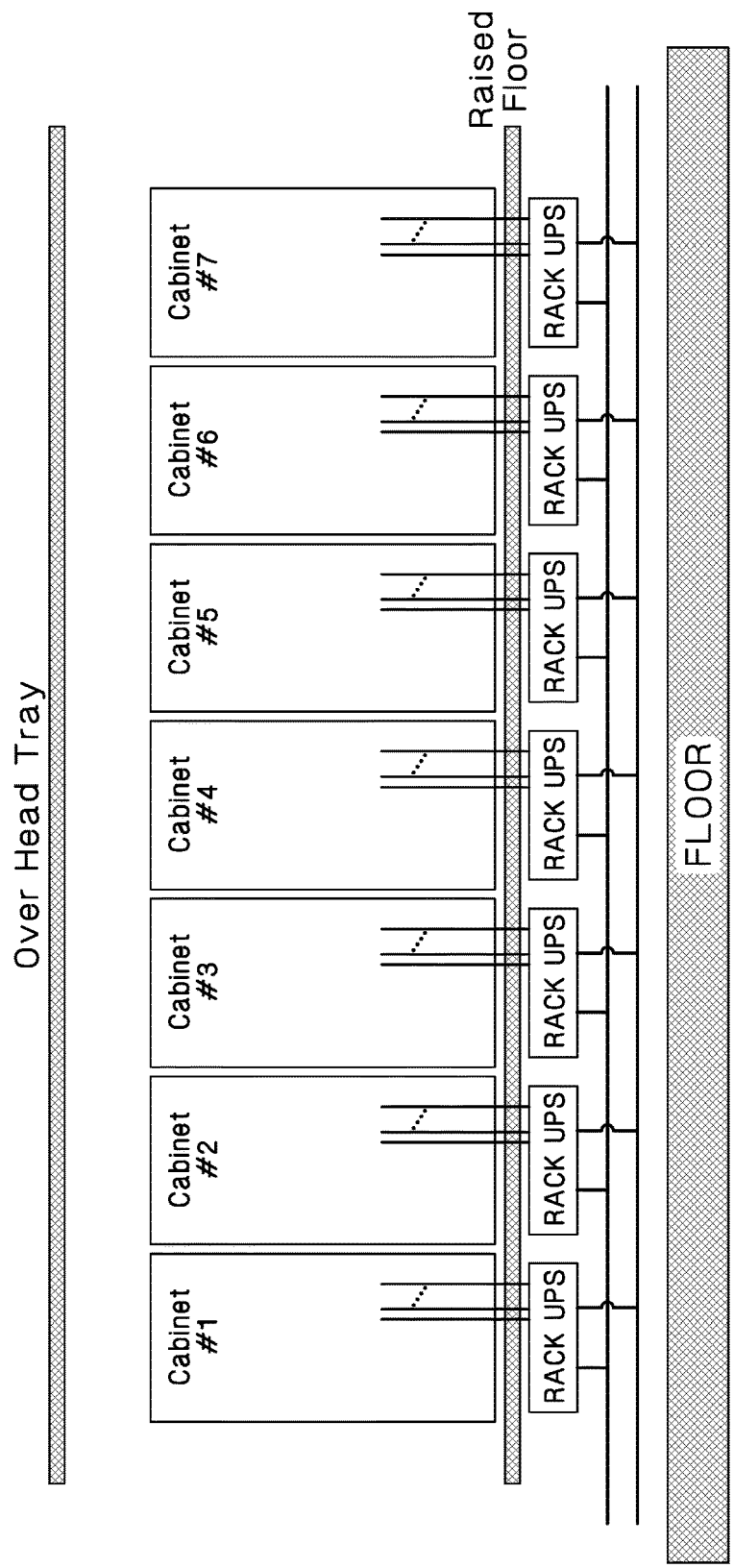

FIG. 4 illustrates an embodiment of the present invention, showing a front view and a rear view of a cabinet 110 with a UPS 105 mounted at the bottom of the cabinet. The rear view shows the DC voltage cabling 115 to the IT-Equipment 120 mounted within the cabinet 110 (in this case a plurality of servers). The DC cables 115 are fused at the back of the UPS 105 unit. Depending on the embodiment, physical placement of the UPS 105 can be varied. For example, in one embodiment the UPS 105 can be mounted in the top section of the cabinet 110 above the IT-Equipment 120. In other embodiments the UPS 105 can be mounted between the IT-Equipment 120. In yet other embodiment, the UPS 105 can be positioned separate from the cabinet 110, including, but not limited to, on an overhead tray, above panels of a ceiling, or underneath floor panels. Some of these embodiments are illustrated in FIGS. 5A and 5B.

Because supercapacitors can be damaged if their voltage exceeds the break down voltage, it is important to have a UPS or a system of linked UPSs that can reduce or attempt to eliminate such occurrences. In one embodiment of a UPS or a UPS system according to the present invention, where the UPS or the UPS system has a break down voltage (for example, about 3V), if one or more capacitors in a series stack is charging faster than the other capacitors (hence building up a voltage faster) or if all the capacitors are not exactly equal to one another, and one or more capacitors exceeds a critical voltage (typically less than the break down voltage), then the charging of this particular capacitor is stopped while the other capacitors catch up. Illustrations of the described behavior are illustrated in FIG. 6.

Figure 6:
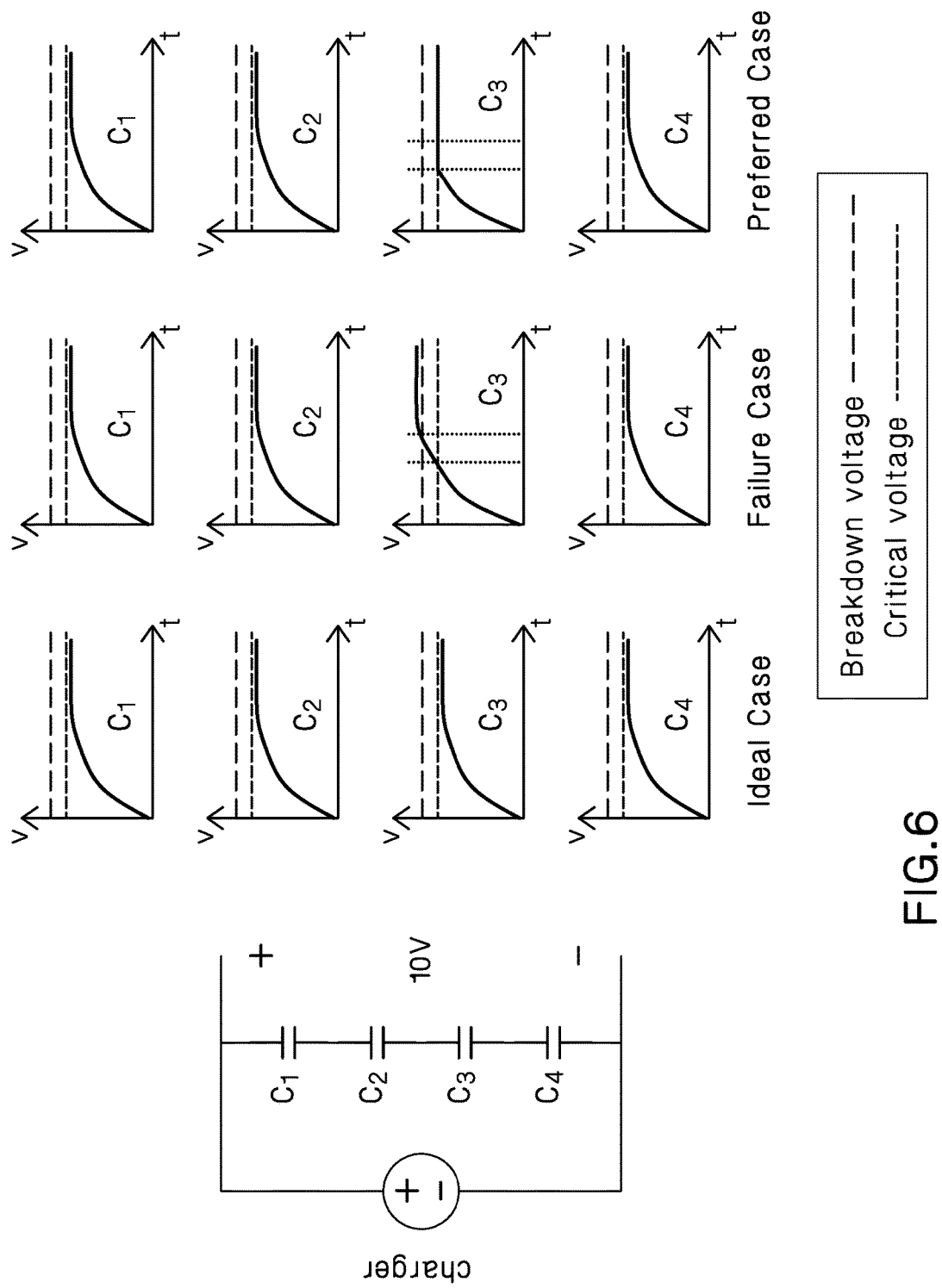
FIG. 6 illustrates charging behavior of various capacitor systems.

With reference to FIG. 6, in the "Ideal Case" when all the capacitors $C_i$ are exactly the same value, they will all charge together and their voltage will rise in the same manner. Monitoring the voltages across each capacitor $C_i$ allows charging to be stopped when any capacitor $C_i$ reaches the critical voltage value (lower than the breakdown voltage value). However, in the "Failure Case," one of the capacitors has a lower capacitance (e.g., $C_3$). In this case $C_3$ will charge faster and could possibly exceed the critical voltage as well as the breakdown voltage if the capacitor voltages are not monitored individually. One solution is to stop the charging whenever any of the capacitor $C_i$ voltages reaches a critical voltage. Another solution would be to stop charging the particular capacitor (or capacitors) $C_i$ that have reached their individual critical voltage as shown in the "Preferred Case." Yet another solution would be to keep the difference between the voltages of the individual capacitors $C_i$ or groups of capacitors within a certain range during the charging cycle.

Figure 7:
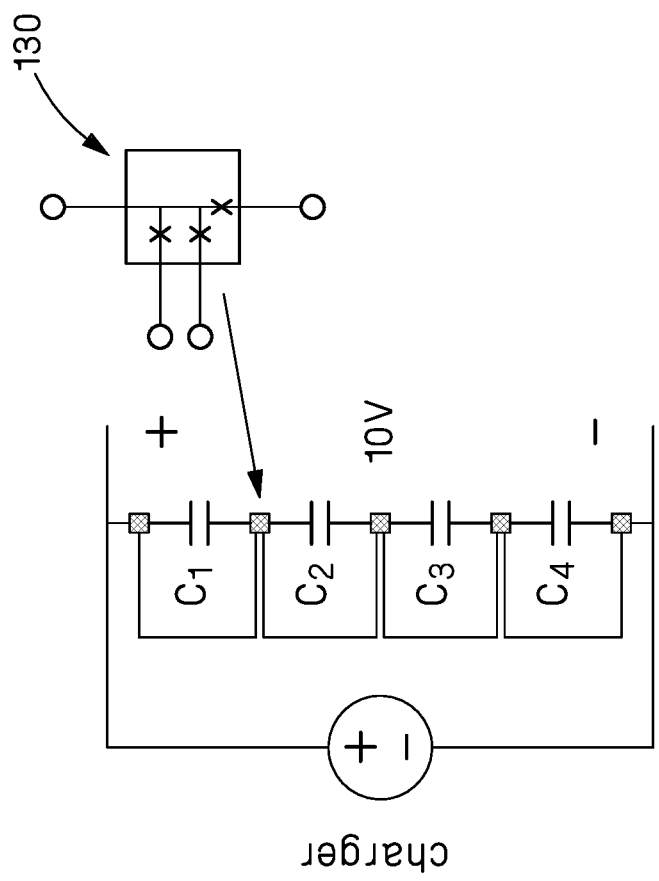
FIG. 7 illustrates various embodiments of the present invention.
Figure 7:
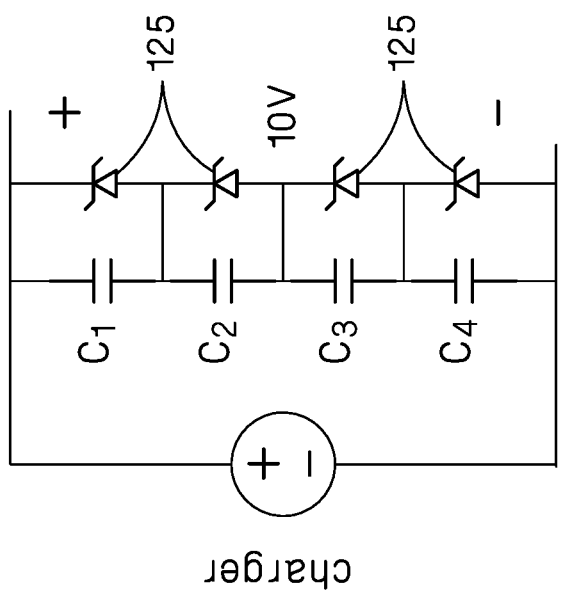

FIG. 7 describes some approaches to addressing the aforementioned charging problem in accordance with some embodiments of the present invention. In the first (left) embodiment, zener diodes 125 are placed across each of the capacitors $C_i$ such that if any of the capacitors exceed the zener voltage (set equal to the critical voltage) the voltage across that capacitor $C_i$ will be clamped and excess current will shunt around the capacitor $C_i$ through the diode 125. In the second (right) embodiment, isolation switches 130 are added to isolate individual capacitors $C_i$ from the charging circuit. Once a capacitor $C_i$ has been fully charged, the isolation switch(s) 130 disconnect that capacitor $C_i$ from the charging circuit.

Figure 8A:
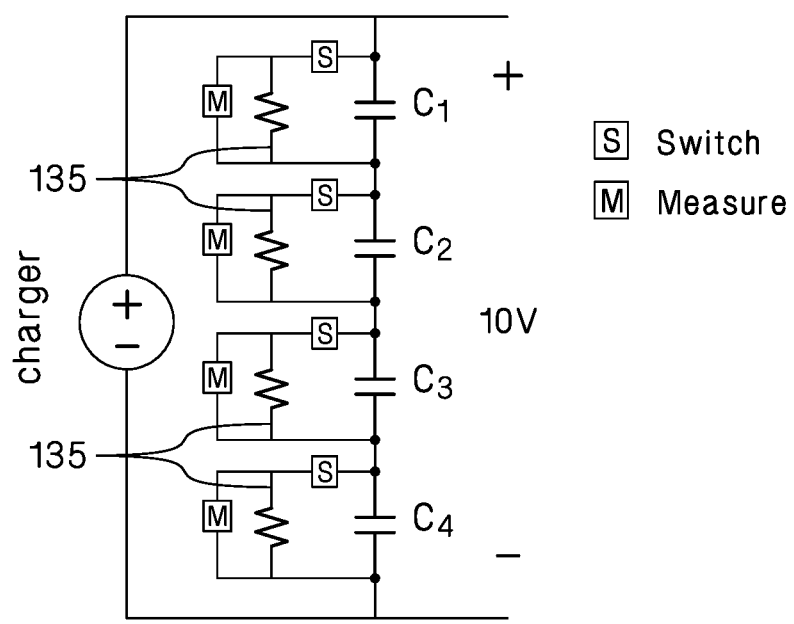
FIGS. 8A and 8B illustrate another embodiment of the present invention.

Yet another embodiment is shown in FIG. 8A, where bleed resistors 135 will shunt at least some of the current away from one or more of the capacitors $C_i$ if they are charging too fast. The bleed resistors are connected to or disconnected from a charging capacitor $C_i$ with an inline switch, and the capacitor voltages are individually monitored in order to determine when to switch in the bleed resistors. The combination of a capacitor $C_i$ and its respective switch and bleed resistor may be referred to as a cell, and the technique of using a bleed resistor to shunt unnecessary current away from a capacitor may be referred to as cell balancing. In one embodiment, the objective for cell balancing is to attempt to ensure that all capacitors (regardless of their actual capacitance value) have a near-same voltage during charging. This can help ensure that no capacitor will inadvertently exceed its breakdown voltage and that a maximum charge will be stored across the capacitor stack.

Figure 8B:
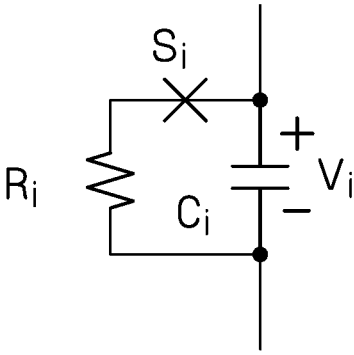

FIG. 8B generally describes the functionality of a single cell by way of a non-limiting embodiment. During the charge interval of the capacitors $C_i$, the switches $S_i$ are normally in the OPEN state. To determine if a particular switch or a series of switches need to be activated, voltages across each cell are monitored (generally monitored across a respective capacitor $C_i$ and denoted $v_i$ in FIG. 8B) and an average cell voltage is determined. If the difference between any monitored cell voltages and the average cell voltage reaches or exceeds a predetermined SWITCH-ON threshold value (e.g., 30 mV (millivolts)), one or more switches $S_i$ may be activated. For example, if the difference indicates that monitored voltage of a particular cell is higher than the average cell voltage, the switch for that particular cell should be closed (activated) and remain closed until the difference between the monitored cell voltage and the average cell voltage is equal to or less than a predetermined SWITCH-OFF threshold value (e.g., 10 mV). Conversely, if the difference indicates that the monitored voltage of a particular cell is lower than the average cell voltage, the switches of all remaining cells (all cells in a serial link excluding the particular cell) should be closed and remain closed until the difference between the average cell voltage and the monitored voltage is again equal to or less than the predetermined SWITCH-OFF threshold value (e.g., 10 mV).

Figure 8C:
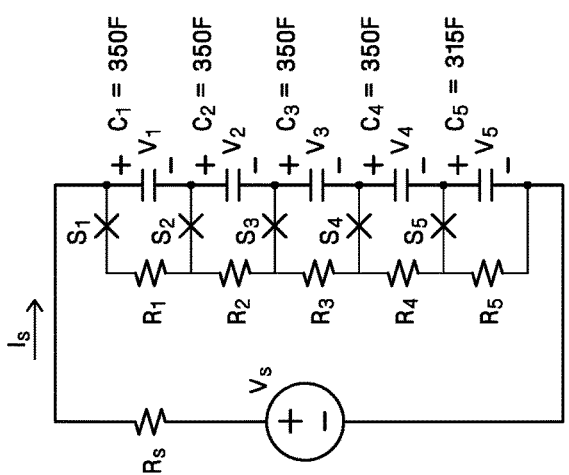
FIGS. 8C and 8D illustrate cell balancing in accordance with an embodiment of the present invention.
Figure 8D:
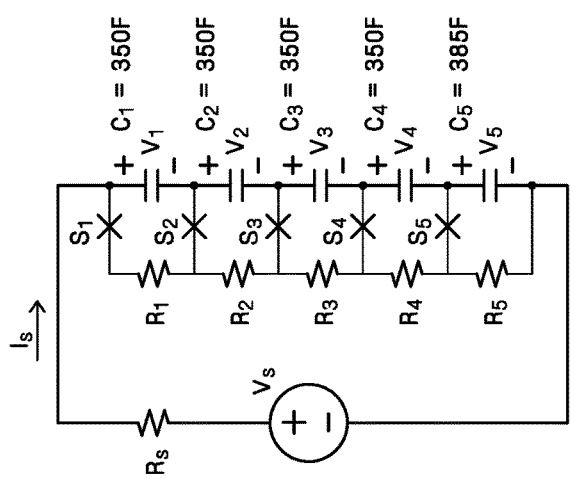

FIGS. 8C and 8D further exemplify cell balancing on a five-capacitor bank (also referred to as a stack) during a charge cycle. Each of the five capacitors $C_i$ has a corresponding voltage $V_i$, where 'i' corresponds to a respective capacitor. The values of the various voltages $v_i$ are shown in the tables of FIGS. 8C and 8D, with each table having a series of columns representing the elapsed time in seconds from the start of a charge.

In FIG. 8C, for Case 1 where cell balancing is not used, the voltage values of each cell capacitor are derived for an example stack of 5 capacitors with nominal capacitor values of 350 F (farads) except for the particular cell capacitor of value 315 F (such variances may exist due to a variety of factors including, but not limited to, manufacturing tolerances and degradation of capacitors over time). The stack is assumed to be charging with a constant current of 1 amp. The result of cell 5 having a lower capacitor value is that this cell charges faster that the remaining cells, and exceeds 3 volts at 960 seconds. Cell 5's voltage is 305 mV larger than the remaining cell voltages. Assuming that the breakdown voltage for the each of the five capacitors is 3 volts, either of two situations can arise: i) cell 5 voltage can exceed the break down voltage or; ii) if the stack charging is terminated early to prevent cell 5 from exceeding its breakdown voltage, than the amount of charge stored in the remaining capacitors is less than what could be optimally stored.

In Case 2 of FIG. 8C where cell balancing is utilized, at the end of charging, a more equal amount of voltage appears across all the capacitor cells. Note that during the charging interval, for cell 5, at some intervals cell balancing is turned on (as seen by the shaded boxes) and during other intervals it is turned back off. For example, at 95 seconds the difference between the voltage of cell 5 and the average voltage of the remaining cells (represented by "delta V") becomes equal to the SWITCH-ON threshold voltage (e.g., 30 mV). Since the voltage of the particular cell (in this case cell 5) is greater than the average voltage of the remaining cells, the switch for that particular cell is activated, bleeding at least some current away from the $C_5$ capacitor and slowing its charge rate. This allows the remaining capacitors to catch up over time. Due to the slowed rate of charge, at 656 seconds the difference between the voltage of cell 5 and the average voltage of the remaining cells becomes equal to the SWITCH-OFF threshold voltage (e.g., 10 mV) causing the switch of cell 5 to be deactivated. This process continues indefinitely to maintain a similar or approximately same rate of charge among all the capacitors of the stack.

In FIG. 8D, cell balancing is described for the case where a capacitor $C_5$ has a higher value than the nominal value of capacitors within the stack. For the case where cell balancing is not used (Case 1 of FIG. 8D), at the time of 960 seconds, cell 5 (with the higher value of capacitance) has not charged up to the same value as the other capacitors have charged to. Hence, there may be loss with respect to additional opportunity of charge storage by not allowing cell 5 to fully charge up such that the voltages would be approximately equal across all capacitors of the stack. The use of cell balancing to achieve a more even charge is exemplified in Case 2. Note that in this case, since at 115 seconds the difference between the voltage of the particular cell (in this case cell 5) becomes lower than the average voltage of the remaining cells by at least the SWITCH-ON threshold value, the switches for all the remaining cells are activated, thereby bleeding at least some current away from the respective capacitors and allowing the slower-charging capacitor $C_5$ to catch up. Once the difference between the voltage of the particular cell and the average voltage of the remaining cells becomes equal to or less than the established SWITCH-OFF threshold (which occurs at 660 seconds in the current example), the switches of the remaining cells are deactivated resuming normal charging. Similar to above, this process continues indefinitely to maintain a similar or approximately same rate of charge among all the capacitors of the stack.

Note that while the above embodiments have been described with particular cell voltages being compared to all or remaining cell voltage averages and determining whether a particular threshold has been reached, other methods of determining a whether a certain cell is in or out of a threshold range are within the scope of the present invention. For example, one may compare the voltage of a particular cell to the voltage of any other particular cell. In another embodiment, one may compare the voltage of a particular cell to the highest/lowest voltage within a capacitor stack. In yet another embodiment, one may implement any combination of the aforementioned techniques.

Figure 8E:
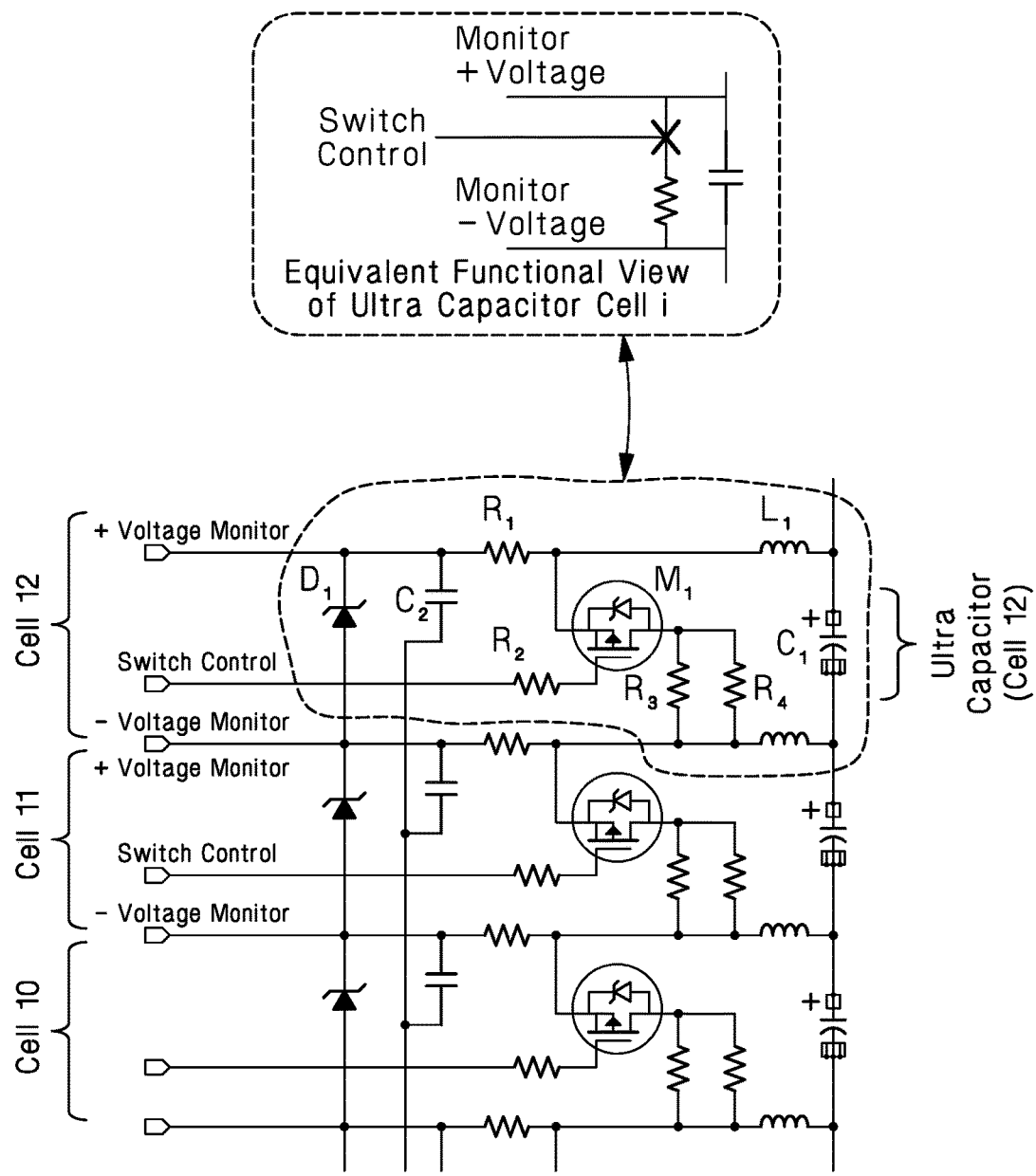
FIG. 8E illustrates a portion of a capacitor stack according to an embodiment of the present invention.

An exemplary schematic for realizing an embodiment of a capacitor stack of the present invention utilizing bleed resistors is shown in FIG. 8E. In this schematic, $C_1$ is an ultra-capacitor (e.g., 350 F) which stores the charge for Cell 12. Capacitor $C_2$ and resistor $R_1$ form an RC low pass filter to reduce noise in the cell's voltage measurement. Inductor $L_1$ provides attenuation of any current transients arising from when the switch closes or opens. $M_1$ is the cell's switch (e.g., a MOSFET) which engages the bleed resistors ($R_3$ and $R_4$) to the ultra-capacitor to slow the rate of charge. Resistor $R_2$ provides connection from a microprocessor control output to the MOSFET switch's gate. It provides resistor isolation and protection for the gate of the MOSFET switch. Resistor $R_3$ and $R_4$ form the bleed resistor. They may be installed in parallel to increase the power rating. Diode $D_1$ provides the overvoltage protection of the microcontroller's analog to digital convertor inputs and in case a cell capacitor is not present or open. The voltage monitor can read the zener voltage (e.g., about 5 volts) if the ultra-capacitor is not present or opens.

Figure 9:
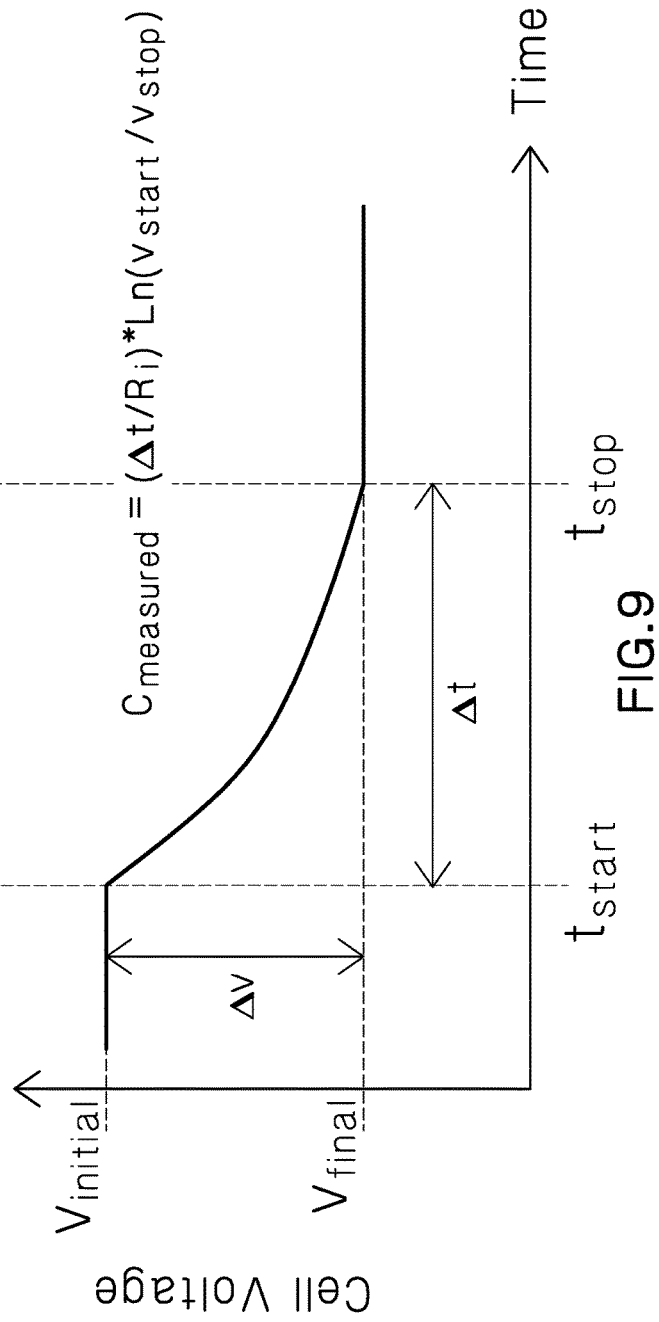
FIG. 9 illustrates a measurement technique according to an embodiment of the present invention.

As noted previously, with a capacitor-based system, in certain embodiments it may be possible to determine the capacity of such a system. In order to calculate the total amount of charge storage (Q=CV) within a stack of capacitors, the cell voltage and cell capacitance must be measured. The cell voltage can be measured through an analog to digital voltage convertor within the control circuitry and the capacitance can be measured by monitoring the cell voltage with the cell switch closed during a finite time interval. An example of this measurement is illustrated in FIG. 9 where the capacitance is measured according to the following:

$$C_{measured} = \left(\frac{\Delta t}{R_i}\right) * \ln\left(\frac{V_{initial}}{V_{final}}\right)$$

In this way the total charge stored across the capacitor stack $C_i$ can be determined. This information can be useful to calculate the real-time "hold-time" with a particular IT-Load and the operational lifetime of the UPS. As used herein, "real-time" can refer to instantaneous or near-instantaneous.

Predicting the amount of hold-time in real-time may be a valuable asset to those who rely on UPS systems. Hold time is based on the energy that is being drawn by the equipment and the amount of remaining energy storage within the ES modules. The amount of remaining energy in a capacitor-based storage element is predicted by the equation $E=(\frac{1}{2})CV^2$. Hence, it is necessary to measure the capacitance. An accurate method to measure the capacitance is to load the capacitor bank and monitor the current flow. The current (I) is related to the capacitance by $I=CV\Delta t$, where C is capacitance, and V is a potential difference, and $\Delta t$ is time period over which the current is monitored. Therefore, by monitoring the current and voltage over a period of time ($\Delta t$) the capacitance can be accurately measured. Thereafter, the capacitance and the energy draw can be used to calculate the remaining hold time.

Figure 10B:
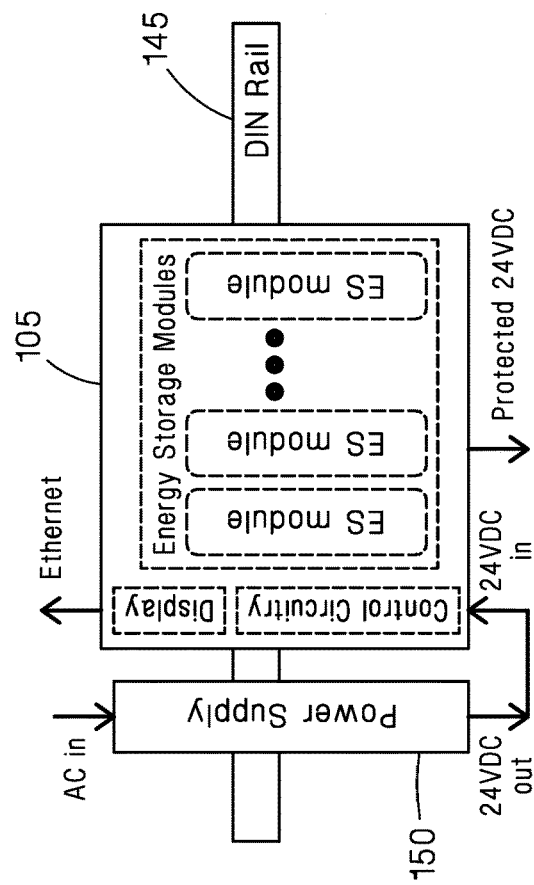
FIG. 10B illustrates a block diagram of a UPS of FIG. 10A.
Figure 10A:
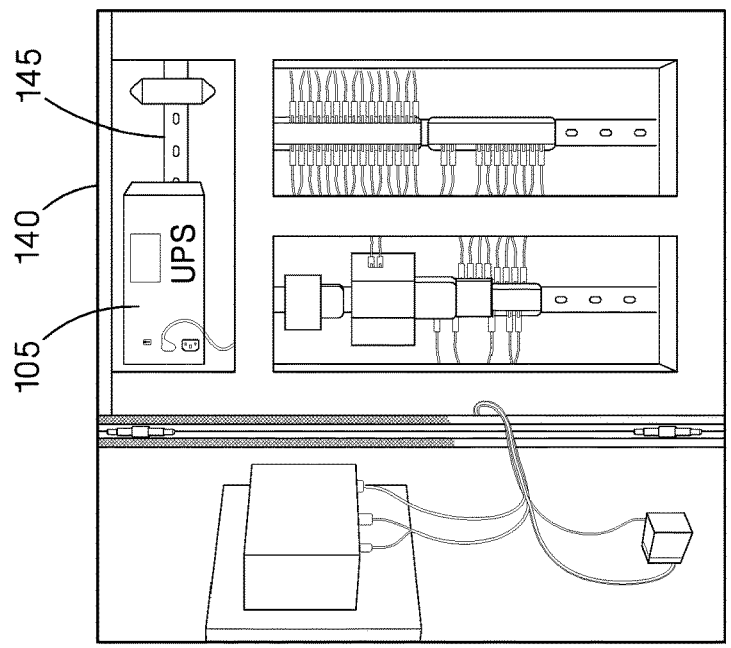
FIG. 10A illustrates an embodiment of a UPS according to the present invention being used in an industrial setting.
Figure 11:
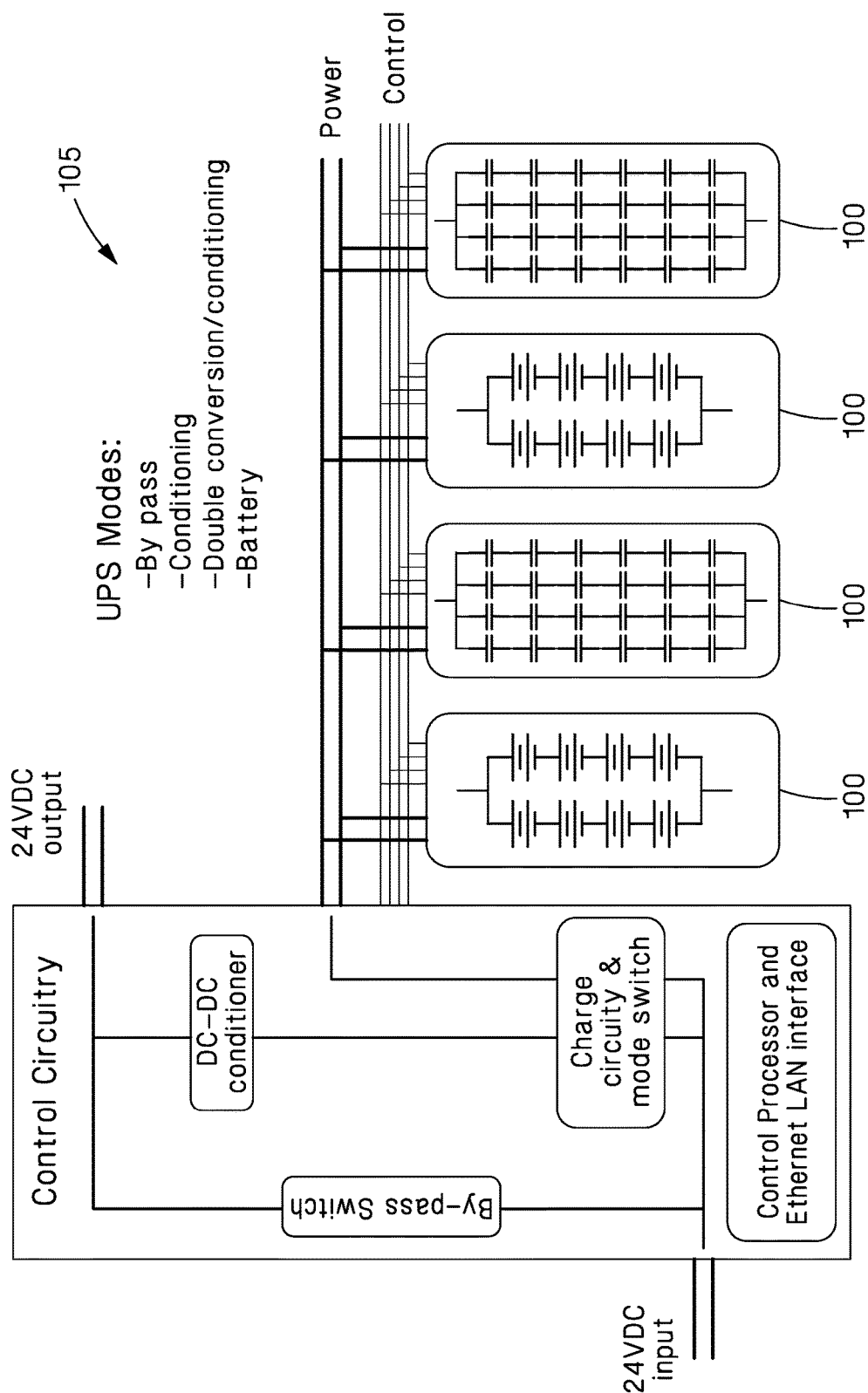
FIG. 11 illustrates a more detailed block diagram of a UPS of FIG. 10A.

In another embodiment, a UPS or a UPS system of the present invention can be used in industrial settings such as industrial zone enclosures or industrial control cabinets. FIG. 10(A) illustrates an embodiment where a UPS 105 of the present invention is used in an industrial application. In this embodiment, the UPS 105 is secured inside an industrial control cabinet 140 and is connected to and/or mounted on a DIN rail 145. The UPS 105 of FIG. 10(A) is small enough to fit inside the control cabinet, allowing the cabinet door to close when so desired. FIG. 10(B) illustrates a high-level block diagram of the UPS 105 of FIG. 10(A), and FIG. 11 illustrates a more detailed view of said UPS. The power supply 150 converts the input AC voltage (e.g., 120 volts AC, 208 volts AC) into DC voltage (e.g., 24 volts DC (VDC)). This 24 VDC is input into the UPS module. While FIG. 10B illustrates the power supply being separate from the UPS, other embodiments may incorporate the power supply into the UPS module. The output voltage of the UPS module is the protected and conditioned 24 VDC that is then applied to the electronic equipment.

In one embodiment, the UPS can perform power measurements at the input, output, and the energy storage module interface. This information can subsequently be used to manage the UPS.

Figure 12B:
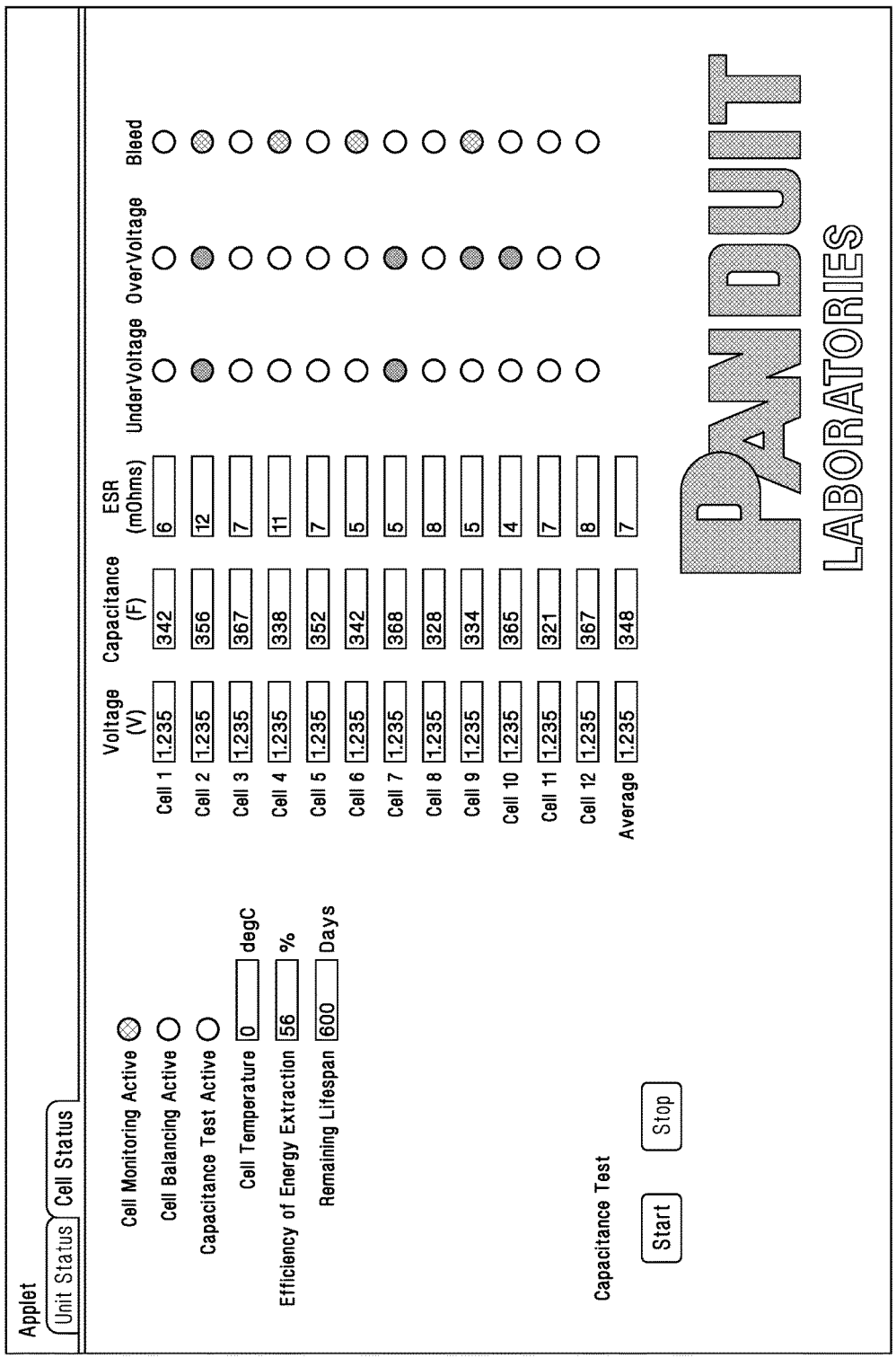

The UPS module also has an optional Ethernet LAN (local area network) interface, to report the status of various trackable variables as well as to input policies into the module for application customization. An example of a computer interface from which the status of a UPS or a UPS system may be viewed and/or controlled from is shown in FIGS. 12A and 12B. Other embodiments of the UPS may employ wireless and/or other means of wired communication in place of an Ethernet LAN connection.

Additionally, the UPS module has an optional display which may be used to display any particular trackable and/or computable variable, a series of variables, or any information related thereto. This display may output the information either based on its pre-programmed parameters, or based on a user's selection, where the user's selection may include directing the UPS to display a particular parameter or cycling through a list of parameters. The user's selection may be achieved by way of a local input (e.g., an electric switch such as a button located on the UPS) or by way of a signal sent through a network interface such as an Ethernet LAN.

Stored internally to the UPS are one or more energy storage (ES) modules 100. These modules can be implemented in various technologies, including, but not limited to, ultra capacitors (such as those described above), lithium-ion, lead-acid, nickel-cadmium, and/or other battery and/or capacitive elements. Such customization may allow a user greater flexibility in finding a better match for the desired applications, as well as retain a potential for future upgrades or other improvements.

Figure 13:
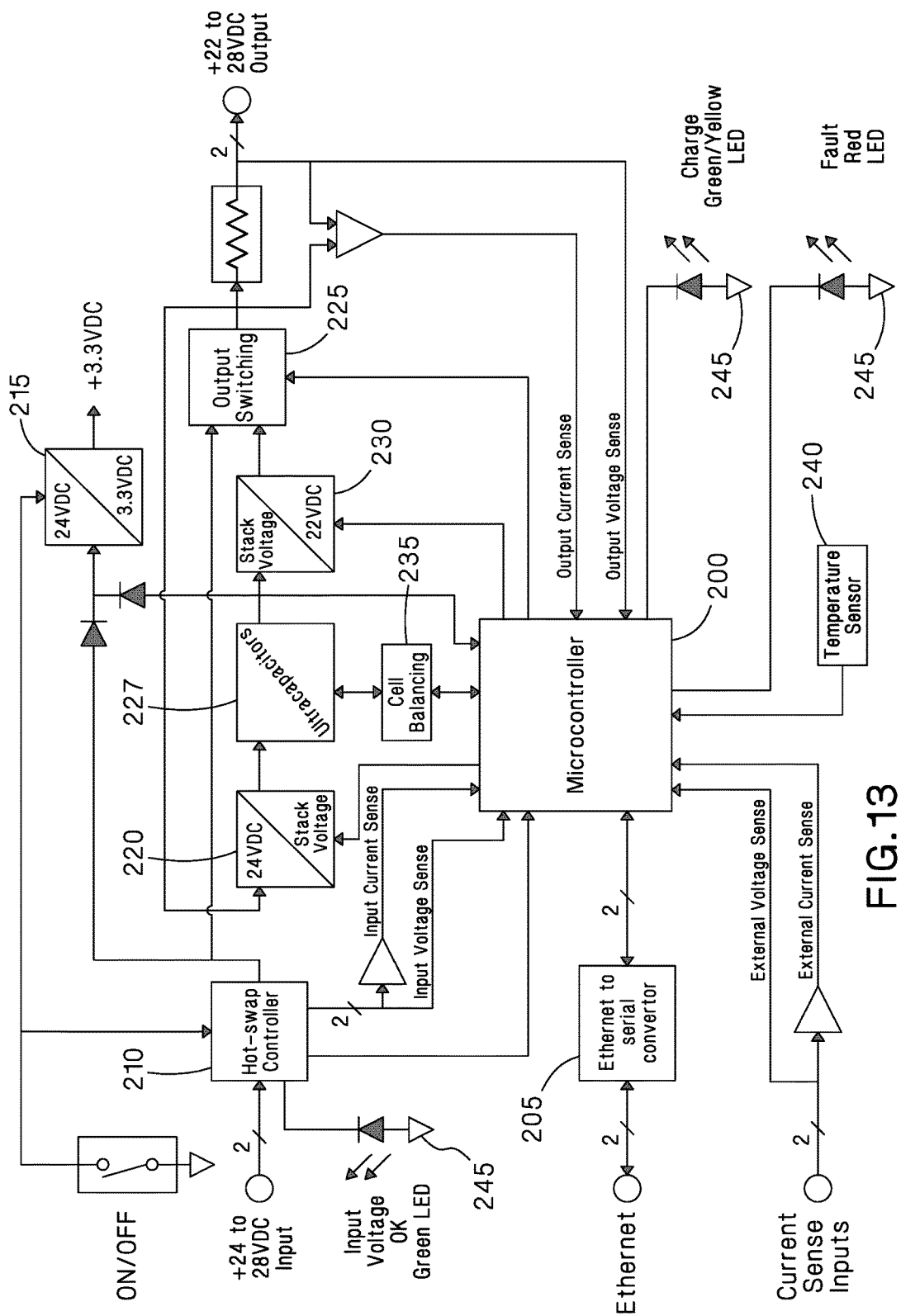
FIG. 13 illustrates a block diagram of an embodiment of the present invention.

A block diagram of a UPS in accordance with an embodiment of the present invention is shown in FIG. 13. In the illustrated embodiment, a microcontroller 200 can act as the controller for the entire UPS unit. It can at least partially control at least one of the maintenance of the ultra-capacitor stack (charging, discharging, capacitor measurements), the management interface to the outside network, status display LEDs, and voltage and the operation of the UPS itself (e.g., when to supply external power to the IT-Equipment or to supply power via the capacitor stack). The UPS further includes an Ethernet to serial convertor 205. This converter provides an interface between a LAN (local area network) or a WAN (wide area network) connection and a serial connection to the microcontroller 200. The information exchanged between a UPS-managing device such as a computer and the UPS passes through/resides with the Ethernet to serial converter 205. The microcontroller 200 can read and write to this converter 205 to update information or get user control information. The illustrated UPS further includes a hot-swap controller 210 which has an input from an external 24 volt power supply and delivers power to the output of the UPS as long as the external 24 volt power supply is operational. The hot-swap controller 210 allows the UPS to remain operational when the external supply is changed to another power supply or when the internal modules are replaced (hence the name hot-swap controller). The microcontroller 200 can further sense/monitor input power current and voltage, and use that information to determine the selection of the power supplies to connect to the output of the UPS. To maintain a reliable voltage supply for the UPS unit, a 24 VDC to 3.3 VDC DC-DC converter 215 with diode "ored" inputs is utilized between the external supply and the capacitor stack. The 24 VDC to Stack Voltage block 220 provides the charging circuitry for the ultra-capacitor stack 227. Block 220 is linked to the output of the "Output Switching" block 225 (which can be either power from the external supply or power from the ultra-capacitor stack), and also provides an output to the stack of ultra-capacitors 227. The Cell Balancing block 235 maintains the voltages across the cells of the ultra-capacitor stack 227 such that optimal capacity is achieved. In the Stack Voltage to 24 VDC block 230 the ultracapacitor stack voltage is converted from the stack voltage to a 24 VDC output. The stack voltage can be higher or lower than 24 VDC. At Output Switching 225 one of the voltage supplies is selected to connect to the output voltage terminals. In the current embodiment, a temperature sensor 240 is connected to the microcontroller 200, which can be utilized to help maintain and/or manage the UPS. Additionally, LEDs 245 are connected to various components of the UPS to help provide a visual indication of the status of at least some parts of the UPS.

Depending on the type of equipment that a UPS is attached to, the importance of and the need for voltage conditioning may vary. In certain embodiments, the UPS of the present invention can be a multi-mode UPS. In such embodiments, the user can select whether the UPS operates in a static way where it is manually adjusted to condition between the input voltage and the battery backup, or in a dynamic autonomous way where the conditioning is adjusted dynamically.

In other embodiments, the operation of a UPS or a UPS system of the present invention can be optimized for operating temperature and capacity. Typically, there is a tradeoff between the lifetime of an energy storage element (such as a capacitor) and the energy storage capability of the energy storage element (i.e., $E=(\frac{1}{2})CV^2$). Lifetime and capacity are inversely related. Additionally, the operating temperature of an energy storage element and its capacitance are also inversely related. Therefore, one can optimize the energy storage system by monitoring and/or tracking the capacitor temperature and adjusting the capacitor voltage to maintain the preset desired lifetime (e.g., 10-15 years). This may allow a user to run the energy storage elements such as capacitors near their maximum voltage rating if the temperature is at a lower level and still maintain the desired ES module lifetime. If the system is experiencing higher operating temperatures, a user can maintain the lifetime of the energy storage element by decreasing its voltage below its maximum voltage rating. However, a reduction of the voltage at higher temperatures might correlate to a reduction in capacity at those temperatures. In this manner, a user can optimize the system based on lifetime and energy storage capacity requirements.

Note that the amount of voltage that the capacitors are charged to can be controlled by the charging circuitry along with the cell balancing technique. If the objective of the present invention is to store more charge, the voltage across the cell(s) can be increased. Such an increase in voltage can result in an increase in hold-time, a lower temperature tolerance, and/or a decrease in lifetime. If the objective of the present invention is to increase the lifetime of the UPS, the cell(s) can be charged to a lower voltage value. Such a lower charge can result in a decrease in hold-time, a higher temperature tolerance, and/or a decrease in capacity. All these parameters can be controlled by the voltage value on the cell capacitors.

Note that while this invention has been described in terms of one or more embodiment(s), these embodiment(s) are non-limiting, and there are alterations, permutations, and equivalents, which fall within the scope of this invention. It should also be noted that there are many alternative ways of implementing the methods and apparatuses of the present invention. It is therefore intended that claims that may follow be interpreted as including all such alterations, permutations, and equivalents as fall within the true spirit and scope of the present invention.

We claim:

1. An uninterruptable power supply (UPS) comprising:
    at least one energy storage module having a plurality of capacitive elements;
    input circuitry for providing electrical power from an input to said at least one energy storage module;
    output circuit for providing electrical power from said at least one energy storage module to an output; and
    charge-balancing circuitry, wherein said charge-balancing circuitry at least partially retards charging of at least one said capacitive element when a voltage across said at least one said capacitive element is determine to be greater than a voltage across at least one other said capacitive element by at least some first threshold amount, and wherein said charge-balancing circuitry resumes normal charging of said at least one said capacitive element when said voltage across said at least one said capacitive element is determined to be less than said voltage across said at least one other said capacitive element by at least some second threshold amount wherein said charge-balancing circuit comprises a bleed resistor and a transistor switch, said bleed resistor being connected in parallel with said at least one said capacitive element when said switch is activated and further wherein said transistor switch has a transistor gate with an isolation resistor connected between the transistor gate and a gate control signal.

2. The UPS of claim 1, wherein said at least one said capacitive element comprises an ultra-capacitor.

3. The UPS of claim 1, wherein said at least one storage module is hot-swappable.

4. The UPS of claim 1, wherein said charge-balancing circuit further comprises an inductor connected in series between said at least one said capacitive element and said bleed resistor.

5. The UPS of claim 1 further comprising a microcontroller, said microcontroller at least partially controlling a maximum charge voltage across said at least one said capacitive element by at least one of activating and deactivating said switch.

6. The UPS of claim 1 further comprising capacity-measuring circuitry in communication with said at least one said capacitive element, said capacity-measuring circuitry measuring a first and a second voltage across said at least one said capacitive element, said measurement of said second voltage occurring at least some time $\Delta t$ after said measurement of said first voltage, and said capacity-measuring circuitry providing an output based at least in part on said first voltage, said second voltage, and said $\Delta t$.

7. An uninterruptable power supply (UPS) comprising:
at least one energy storage module having a plurality of capacitive elements;
input circuitry for providing electrical power from an input to said at least one energy storage module;
output circuit for providing electrical power from said at least one energy storage module to an output;
communication circuitry providing a data communication link to an external managing device;
a microcontroller connected to said communication circuitry and said at least one energy storage module, said microcontroller at least partially controlling a maximum charge voltage across at least one said capacitive element in response to an input received from said communication circuitry; and
charge-balancing circuitry, wherein said charge-balancing circuitry at least partially retards charging of said at least one said capacitive element when a voltage across said at least one said capacitive element is determine to be greater than a voltage across at least one other said capacitive element by at least some first threshold amount, and wherein said charge-balancing circuitry resumes normal charging of said at least one said capacitive element when said voltage across said at least one said capacitive element is determined to be less than said voltage across said at least one other said capacitive element by at least some second threshold amount wherein said charge-balancing circuit comprises a bleed resistor and a switch, said bleed resistor being connected in parallel with said at least one said capacitive element when said switch is activated and further wherein said transistor switch has a transistor gate with an isolation resistor connected between the transistor gate and a gate control signal.

8. The UPS of claim 7, wherein said at least one said capacitive element comprises an ultra-capacitor.

9. The UPS of claim 7, wherein said at least one storage module is hot-swappable.

10. The UPS of claim 7, wherein said charge-balancing circuit further comprises an inductor connected in series between said at least one said capacitive element and said bleed resistor.

11. The UPS of claim 7 further comprising capacity-measuring circuitry in communication with said at least one said capacitive element, said capacity-measuring circuitry measuring a first and a second voltage across said at least one said capacitive element, said measurement of said second voltage occurring at least some time $\Delta t$ after said measurement of said first voltage, and said capacity-measuring circuitry providing an output based at least in part on said first voltage, said second voltage, and said $\Delta t$.

* * * * *